(12) United States Patent
Singer et al.

(10) Patent No.: US 11,101,249 B2
(45) Date of Patent: Aug. 24, 2021

(54) MULTI-CHIP MODULE WITH LIGHT-EMITTING DIODE (LED) CHIPS CONFIGURED FOR SURFACE MOUNT TECHNOLOGY (SMT)

(71) Applicant: OSRAM Opto Semiconductors GmbH, Regensburg (DE)

(72) Inventors: Frank Singer, Regenstauf (DE); Jürgen Moosburger, Lappersdorf (DE); Thomas Schwarz, Regensburg (DE); Lutz Hoeppel, Alteglofsheim (DE); Matthias Sabathil, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/322,069

(22) PCT Filed: Aug. 1, 2017

(86) PCT No.: PCT/EP2017/069383
§ 371 (c)(1),
(2) Date: Jan. 30, 2019

(87) PCT Pub. No.: WO2018/024705
PCT Pub. Date: Feb. 8, 2018

(65) Prior Publication Data
US 2019/0189598 A1    Jun. 20, 2019

(30) Foreign Application Priority Data

Aug. 2, 2016  (DE) .......................... 102016114275.1

(51) Int. Cl.
*H01L 25/075* (2006.01)
*H01L 33/62* (2010.01)
(Continued)

(52) U.S. Cl.
CPC .......... *H01L 25/0753* (2013.01); *H01L 33/56* (2013.01); *H01L 33/58* (2013.01);
(Continued)

(58) Field of Classification Search
CPC ..... H01L 25/0753; H01L 33/54; H01L 33/56; H01L 33/58; H01L 33/62; H01L 2933/0066
See application file for complete search history.

(56) References Cited

U.S. PATENT DOCUMENTS 9,153,735 B2    10/2015  Schneider et al.
2003/0160258 A1   8/2003  Oohata
(Continued)

FOREIGN PATENT DOCUMENTS

CN    103210510 A    7/2013
CN    103824848 A    5/2014
(Continued)

*Primary Examiner* — Andrew Q Tran
(74) *Attorney, Agent, or Firm* — Slater Matsil, LLP

(57) ABSTRACT

In an embodiment, a multi-chip module includes a first carrier including a mold material and at least two light-emitting diode chips embedded at least by side faces in the first carrier, wherein the light-emitting diode chips have first electrical contacts on a front side and second electrical contacts on a rear side, wherein the front side is configured as a radiation side, wherein the first electrical contacts are connected to control lines, wherein the control lines are arranged on a front side of the first carrier, wherein the second electrical contacts are connected to a collective line, and wherein the collective line is led to a rear side of the first carrier.

20 Claims, 12 Drawing Sheets

(51) Int. Cl.
*H01L 33/56* (2010.01)
*H01L 33/58* (2010.01)
*H01L 33/54* (2010.01)

(52) U.S. Cl.
CPC .............. *H01L 33/62* (2013.01); *H01L 33/54* (2013.01); *H01L 2933/0066* (2013.01)

(56) References Cited

U.S. PATENT DOCUMENTS

| | | | |
|---|---|---|---|
| 2009/0218588 A1* | 9/2009 | Panaccione | H01L 33/486 |
| | | | 257/99 |
| 2010/0067243 A1 | 3/2010 | Muraguchi | |
| 2010/0276706 A1* | 11/2010 | Herrmann | H01L 33/0079 |
| | | | 257/89 |
| 2013/0285084 A1 | 10/2013 | Schneider et al. | |
| 2016/0276545 A1 | 9/2016 | Mueller et al. | |
| 2018/0204823 A1 | 7/2018 | Schwarz et al. | |

FOREIGN PATENT DOCUMENTS

| | | |
|---|---|---|
| DE | 102010046254 A1 | 4/2012 |
| DE | 102015112556 A1 | 2/2017 |
| JP | 2010027943 A | 2/2010 |
| WO | 2012038483 A2 | 3/2012 |
| WO | 2015062867 A1 | 5/2015 |

\* cited by examiner

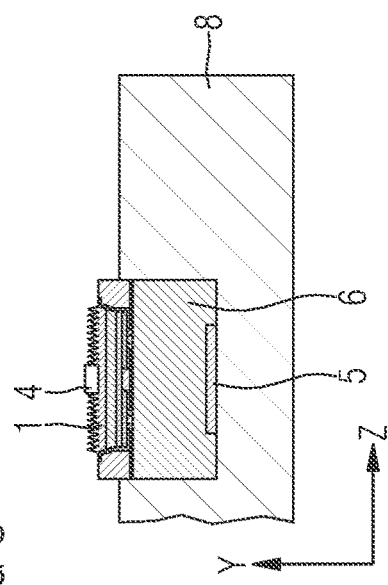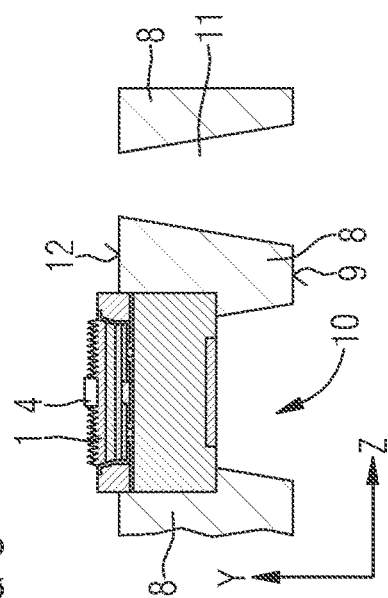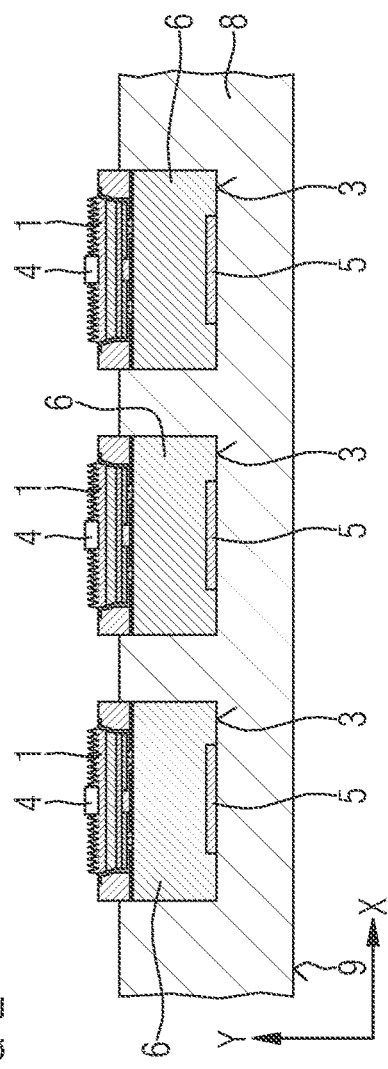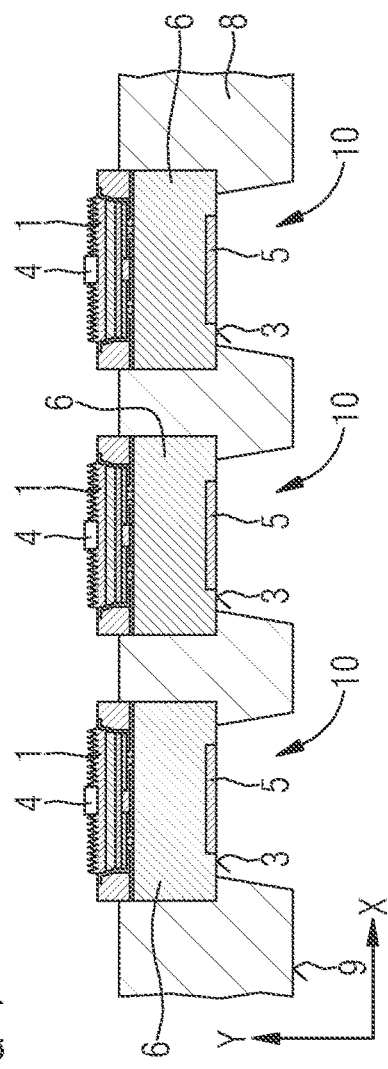

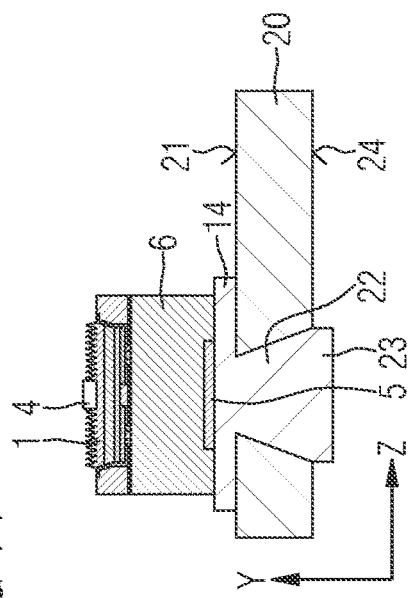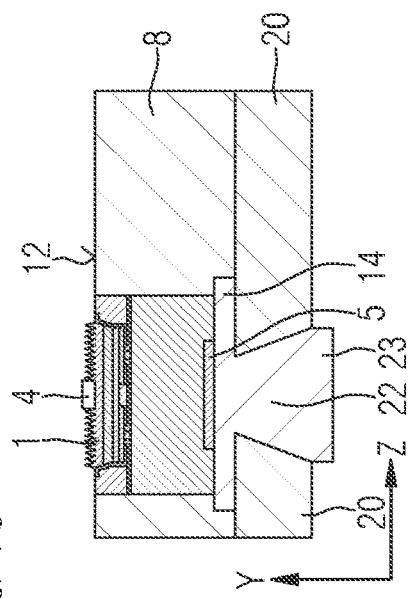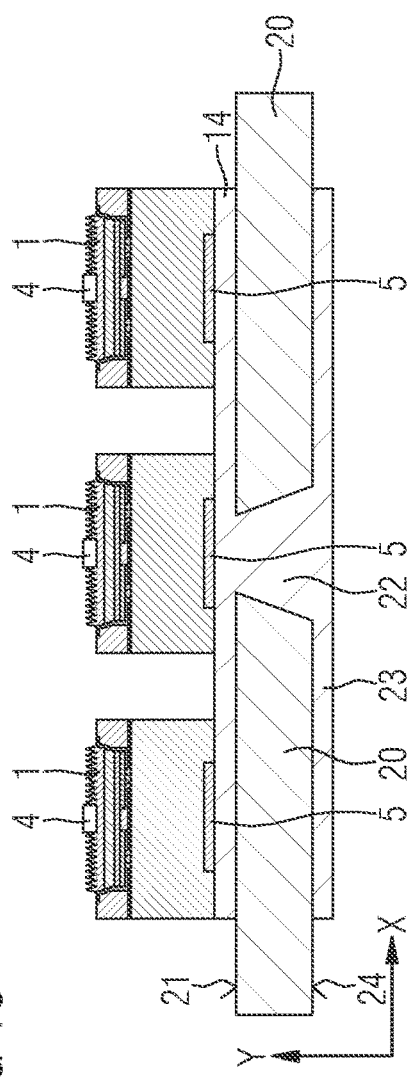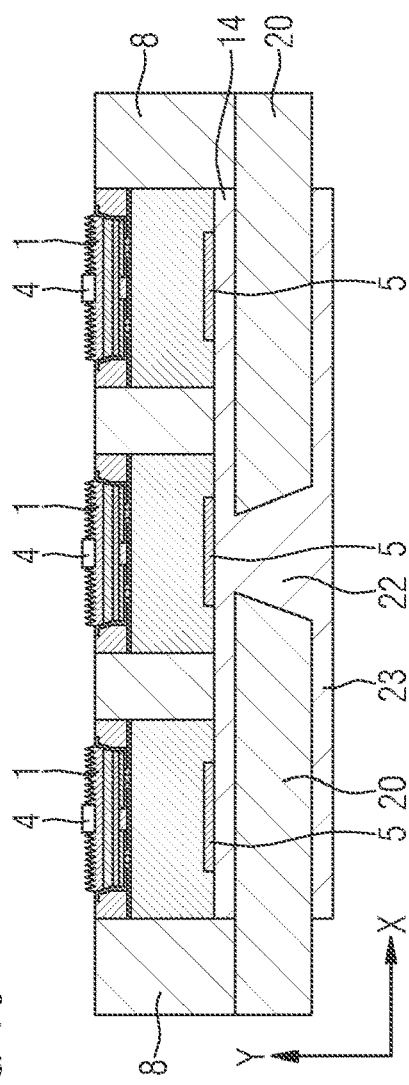

MULTI-CHIP MODULE WITH LIGHT-EMITTING DIODE (LED) CHIPS CONFIGURED FOR SURFACE MOUNT TECHNOLOGY (SMT)

This patent application is a national phase filing under section 371 of PCT/EP2017/069383, filed Aug. 1, 2017, which claims the priority of German patent application 102016114275.1, filed Aug. 2, 2016, each of which is incorporated herein by reference in its entirety.

TECHNICAL FIELD

The invention relates to a multi-chip module.

BACKGROUND

In the prior art it is known to arrange a plurality of light-emitting diode chips on a circuit board in order to realize an image pixel of a video wall.

SUMMARY OF THE INVENTION

Embodiments provide a simplified multi-chip module and a simplified method for producing a multi-chip module.

Embodiments also provide a multi-chip module, wherein light-emitting diode chips are embedded in a carrier comprising a mold material. The light-emitting diode chips comprise a first electrical contact in each case on the front side. Moreover, the light-emitting diode chips comprise a second electrical contact on the rear side. The second electrical contacts are connected to a collective line arranged on a rear side of the first carrier. The first electrical contacts are connected to a control line, wherein the control lines are arranged on a front side of the first carrier. A simply constructed multi-chip module may be provided in this way.

In one embodiment, electrically conductive plated-through holes are provided in the first carrier and are led from the front side to the rear side of the first carrier, wherein a control line is connected to a plated-through hole. In this way, a multi-chip module is provided in which both the first and the second electrical contacts of the light-emitting diode chips are accessible on the rear side of the first carrier. A multi-chip module configured as a surface-mountable device is thus provided.

In one embodiment, an optically transparent cover layer is arranged on the front side of the first carrier, wherein the control lines are arranged between the cover layer and the first carrier. The light-emitting diode chips and the control lines are thus protected vis-á-vis environmental influences.

In a further embodiment, control circuits configured for driving the light-emitting diode chips are provided between the first carrier and the cover layer. A compact construction of the multi-chip modle comprising control circuits for the light-emitting diodes is provided in this way. Depending on the embodiment chosen, a control circuit may be provided for each light-emitting diode chip. As a result, each light-emitting diode chip may be driven individually. The arrangement of the control circuits between the carrier and the cover layer enables a simple method for producing the control circuits, wherein the control circuits are additionally protected vis-á-vis environmental influences.

Depending on the embodiment chosen, a control circuit may comprise at least one transistor, in particular two transistors and a capacitor. The control circuit may be formed, e.g., using TFT technology.

Improved radiation of the multi-chip module is achieved by virtue of the fact that, in one embodiment, the control circuit and/or the control lines and/or the drive lines consist(s) of an optically transparent material. The optically transparent material may be, for example, transparent conductive oxide (TCO) such as, for example, indium tin oxide, indium zinc oxide, a carbon nanotube film or a transparent electrically conductive polymer.

In a further embodiment of the multi-chip module, the first carrier is arranged on the top side of a second carrier, wherein the second carrier comprises a second conductive connection led from a top side to an underside of the second carrier, wherein the second connection is connected to the collective line. In this way, the electrical contacting of the second electrical contacts is led onto an underside of the second carrier. As a result, a stabler construction of the multi-chip module may be achieved, wherein the electrical contacting of the second electrical contacts of the light-emitting diode chips on the underside of the second carrier is nevertheless possible.

In a further embodiment, the first electrical contacts of the light-emitting diode chips are also led via conductive connections through the second carrier onto an underside of the second carrier. Consequently, in the case of an arrangement comprising a second carrier, too, the first electrical contacts of the light-emitting diode chips may be electrically contacted via the underside of the second carrier. Consequently, a surface-mountable multi-chip module is also provided in the case of the arrangement comprising two carriers.

In a further embodiment, electrical lines are provided on the front side of the first carrier, wherein the electrical lines are connected to the first electrical terminals of the light-emitting diode chips, and wherein the electrical lines are led laterally to terminal contacts at the edge region of the first carrier. In this way, the first electrical contacts of the light-emitting diode chips may be electrically contacted via a front side of the first carrier.

In a further embodiment, the first carrier comprises a fourth electrically conductive connection led from a top side to an underside of the first carrier, wherein the fourth conductive connection is connected to the collective line. The fourth conductive connection is additionally connected to a fifth electrical line, wherein the fifth line is led on the front side of the first carrier laterally outward to terminal contacts. Consequently, the second electrical contacts of the light-emitting diode chips may be electrically contacted via a front side of the first carrier.

Depending on the embodiment chosen, the second carrier may be configured as a leadframe or as a circuit board. In the configuration as a leadframe, the leadframe may also be formed from an electrically conductive material and simultaneously constitute the electrical connection between a front side and a rear side of the leadframe. In the configuration of the circuit board, the electrical connection between the front side and the rear side of the circuit board is formed with the aid of a plated-through hole comprising an electrically conductive material.

In a further embodiment, the second carrier is arranged on a third carrier. The third carrier comprises a fifth electrical line connected to the second conductive connection. Moreover, the third carrier is covered with a mold layer that at least partly covers side faces of the first carrier. In this way, a compact construction of the multi-chip module is achieved which is suitable in particular for arranging a plurality of second carriers with light-emitting diode chips on the third carrier.

In a further embodiment, the first carrier is formed integrally and in materially unary fashion with the mold layer.

In accordance with a further aspect of the invention, a method for producing a multi-chip module is provided, wherein at least two light-emitting diode chips are embedded at least by side faces in a first carrier comprising a mold material. The light-emitting diode chips comprise first electrical contacts on a front side. The front side is configured as a radiation side. The light-emitting diode chips comprise second electrical contacts on a rear side. The second electrical contacts are connected to a collective line. The collective line is led to a rear side of the first carrier. The first contacts are connected to control lines, wherein the control lines are arranged on the front side of the first carrier. A simple method for producing a multi-chip module is provided in this way.

BRIEF DESCRIPTION OF THE DRAWINGS

The invention is explained in greater detail below with reference to the figures, in which FIGS. 1 to 12 show method steps of a first method for producing a multi-chip module, FIGS. 13 to 23 show method steps of a second method for producing a multi-chip module comprising a cover layer.

DETAILED DESCRIPTION OF ILLUSTRATIVE EMBODIMENTS

Figure 1:
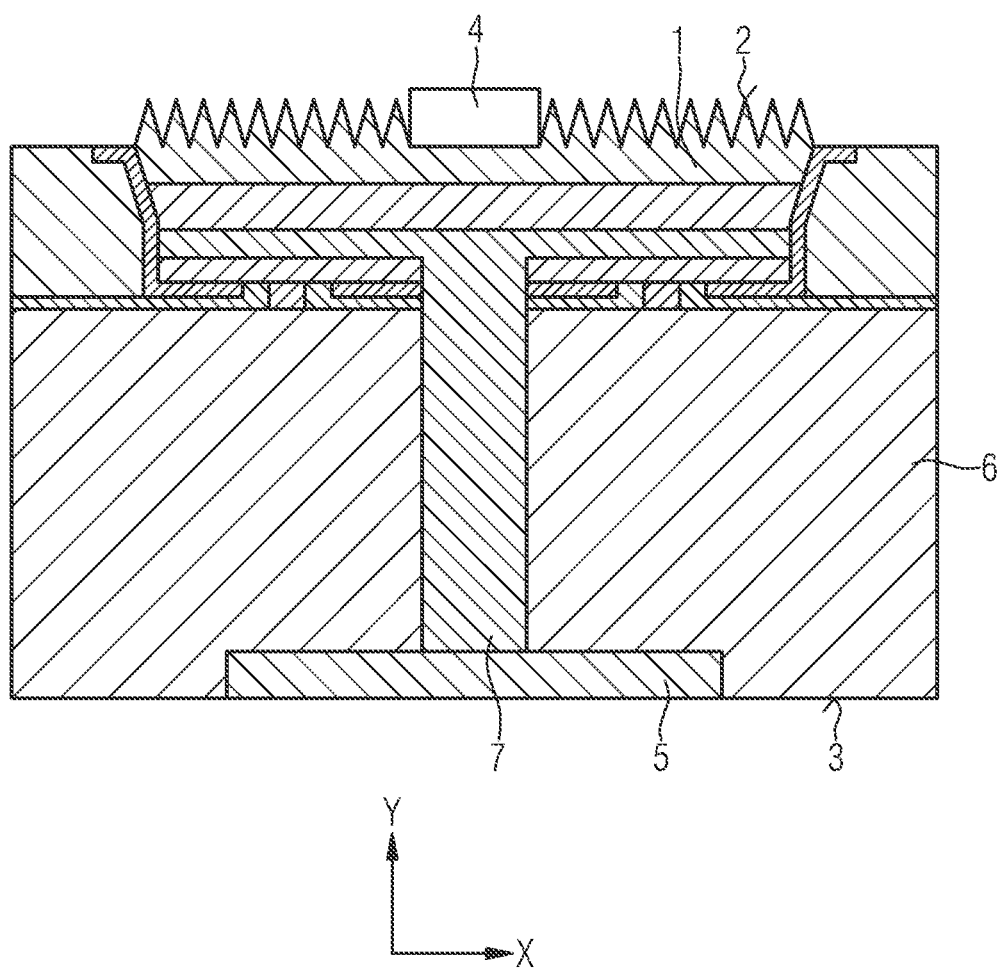

FIG. 1 shows a light-emitting diode chip 1 in a schematic cross section in a Y-X-plane, wherein the light-emitting diode chip 1 comprises a radiation side 2 arranged opposite in relation to a rear side 3. The Y-axis and the X-axis are perpendicular to one another. The light-emitting diode chip 1 comprises a first electrical contact 4 on the radiation side 2. Moreover, the light-emitting diode chip 1 comprises a second electrical contact 5 on the rear side 3. The light-emitting diode chip 1 is configured, for example, as a semiconductor chip comprising a pn structure and an active zone. In this case, it is possible to electrically contact the first electrical contact 4 with the p-side and the second electrical contact 5 with the n-side of the semiconductor structure. The light-emitting diode chip 1 may be produced, for example, from a III-V compound semiconductor or from a II-VI compound semiconductor. By way of example, the light-emitting diode chip may be constituted from indium gallium arsenide, gallium arsenide phosphide, aluminum indium gallium phosphide, gallium phosphide, silicon carbide, zinc selenide, indium gallium nitrite or gallium nitrite.

Depending on the embodiment chosen, the light-emitting diode chip 1 may be embedded in a main body 6, as is illustrated in FIG. 1. Depending on the embodiment chosen, the main body 6 may also be dispensed with. In the configuration of the main body 6, the second electrical contact 5 is arranged on a rear side 3 of the main body 6 and is electrically conductively connected to the light-emitting diode chip 1 via an electrically conductive connection 7. By means of a corresponding energization of the electrical contacts 4, 5, the light-emitting diode chip 1 is caused to emit light, wherein electromagnetic radiation is emitted at least via the radiation side 2. Light-emitting diode chips 1 comprising a main body 6 are used hereinafter. However, light-emitting diode chips 1 without a main body may be used in the same way.

FIG. 2 shows, in a cross section in the Y-X-plane, an arrangement of three light-emitting diode chips 1 embedded in a first carrier 8. The first carrier 8 is constituted from a mold material. The mold material may comprise silicone and/or epoxy material, for example. In the embodiment illustrated, the light-emitting diode chips 1 are covered with the mold material on all side faces and on the rear side 3. The radiation side 2 of the light-emitting diode chips 1 is free of the mold material. Depending on the embodiment chosen, the light-emitting diode chips 1 may also be enclosed by molding in such a way that the rear side 3 of the light-emitting diode chips 1 is free of the mold material. Three light-emitting diode chips 1 embedded in the first carrier 8 are illustrated merely by way of example in FIG. 2. Depending on the embodiment chosen, more or else fewer light-emitting diode chips 1 may be embedded in the first carrier 8.

FIG. 3 shows a cross section through a light-emitting diode chip 1 perpendicular to the illustration in FIG. 2. FIG. 3 illustrates the cross section in the y-z-plane, wherein the y-axis is arranged perpendicular to the z-axis. The z-axis is thus also arranged perpendicular to the x-axis.

FIG. 4 shows a further method step with a cross section in the y-x-plane, wherein recesses 10 for each light-emitting diode chip 1 are introduced into a rear side 9 of the first carrier 8. The recesses 10 extend from the rear side 9 of the first carrier 8 as far as the rear side 3 of the light-emitting diode chip 1. The recesses 10 are separated from one another. In the embodiment illustrated, the cross section of the recesses 10 in the Y-X-plane is configured in a manner tapering slightly conically in the direction of the light-emitting diode chip 1.

FIG. 5 shows a cross section through a light-emitting diode chip 1 of the arrangement from FIG. 4 in the y-z-plane. In this case, it is evident that next to the light-emitting diode chip 1 a second recess 11 is introduced into the first carrier 8. The second recess 11 extends from the rear side 9 of the first carrier 8 as far as a front side 12 of the first carrier 8. The second recess 11 likewise comprises a cross section configured in a manner tapering conically in the direction of the front side 12. The recess 10 and the second recess 11 may be introduced into the first carrier 8, for example, with the aid of a laser or with the aid of drilling or etching methods. The second recess 11 is at a distance from the light-emitting diode chip 1 laterally in the z-direction. In the embodiment illustrated, for each light-emitting diode chip 1 a corresponding second recess 11 is formed in the first carrier 8.

Figure 6:
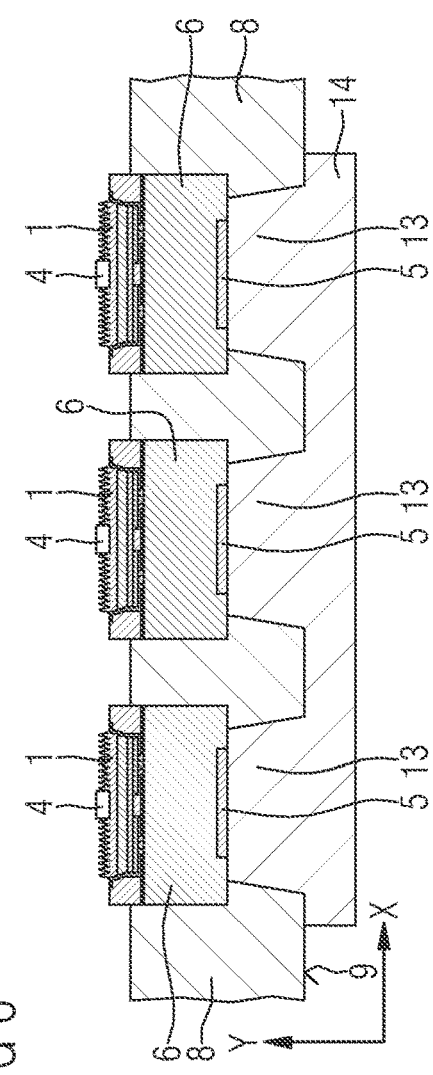

FIG. 6 shows a further method step, in which the recesses 10 are filled with an electrically conductive material 13. The electrically conductive material 13 is in contact with the second electrical contacts 5 of the light-emitting diode chips 1. Moreover, the electrically conductive material 13 is arranged on the rear side 9 of the first carrier 8 at least in a region between the recesses 10. The electrically conductive material 13 of the recesses 10 forms a collective line 14. In the embodiment illustrated, the second electrical contacts 5 of three light-emitting diode chips 1 are electrically connected to one another via a collective line 14. Depending on the embodiment chosen, it is also possible for only two second electrical contacts 5 of two light-emitting diode chips 1 to be connected to a collective line 14. In addition, it is also possible for more than three second electrical contacts 5 of three light-emitting diode chips 1 to be connected to a collective line 14. By way of example, a separate collective line 14 may be provided for each light-emitting diode chip 1. The electrically conductive material 13 may be introduced into the recesses 10 and applied on the rear side 9 of the first carrier 8, for example, by lithography methods and electroplating. By way of example, a metal, in particular a high-grade metal, and/or layers of different metals may be used as material for the electrically conductive material 13.

Figure 7:
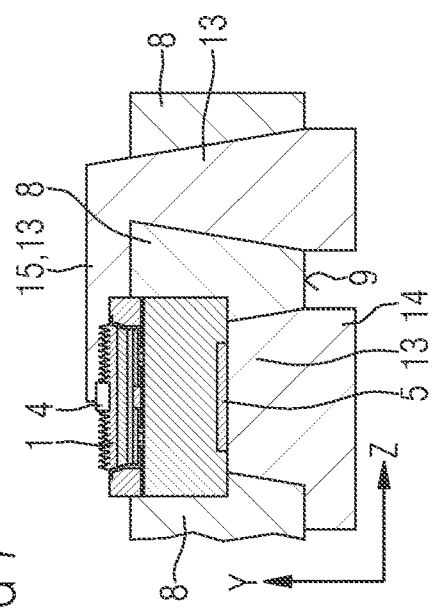

In addition, in this method step, as is illustrated in FIG. 7, the second recesses 11 are also filled with the electrically conductive material 13. FIG. 7 shows a cross section of the arrangement from FIG. 6 in the y-z-plane. In addition, in this method step, an electrically conductive material 13 is applied on the front side 12 of the first carrier 8 for each second recess 11 and is connected to the first electrical contact 4 of the light-emitting diode chip. On the front side 12, the electrically conductive material 13 forms a control line 15 that is led via an electrical plated-through hole 17 through the second recess 11 on the rear side 9 of the first carrier 8.

Figure 8:
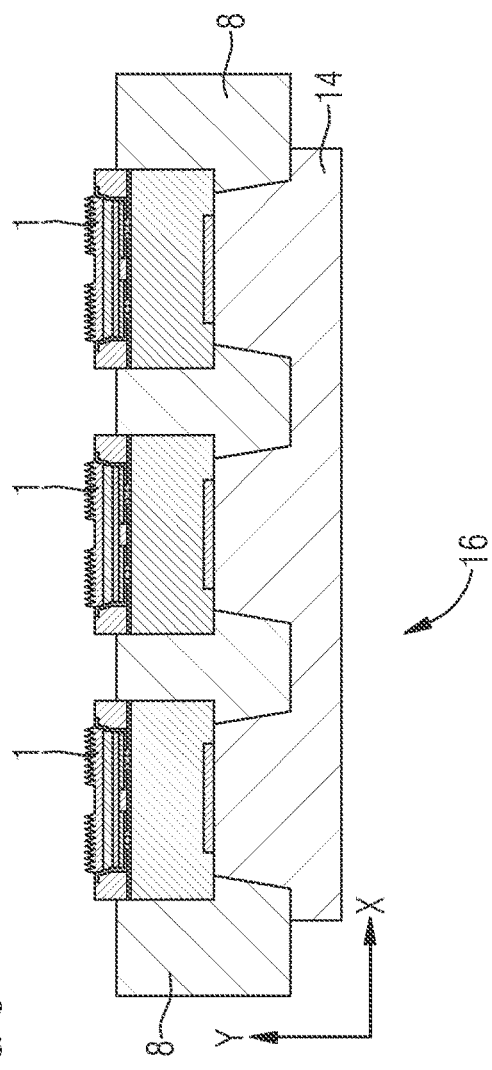
Figure 9:
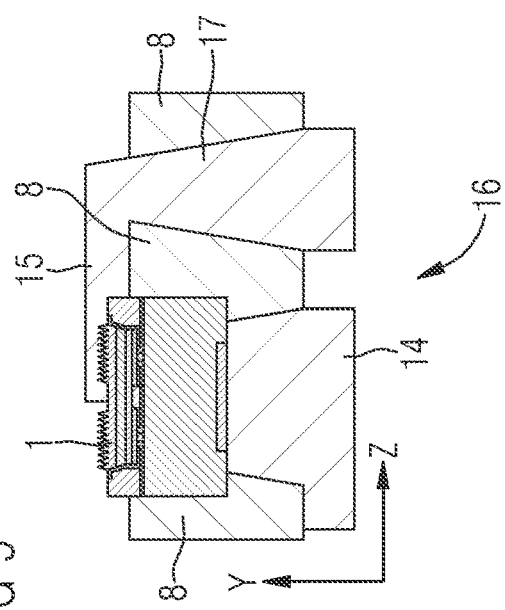

In a further method step, groups of light-emitting diode chips 1 that are connected to the collective line 14 are released from the first carrier 8 and singulated. FIG. 8 shows a group 16 of three light-emitting diode chips 1 that are singulated and constitute a multi-chip module. FIG. 9 shows a cross section through a light-emitting diode chip 1 of the group 16 from FIG. 8 in the y-z-plane. The plated-through hole 17 via which the first electrical contact 4 of the light-emitting diode chip 1 is led in an electrically conductive fashion to the rear side 9 of the first carrier 8 is clearly discernible here.

Figure 10:
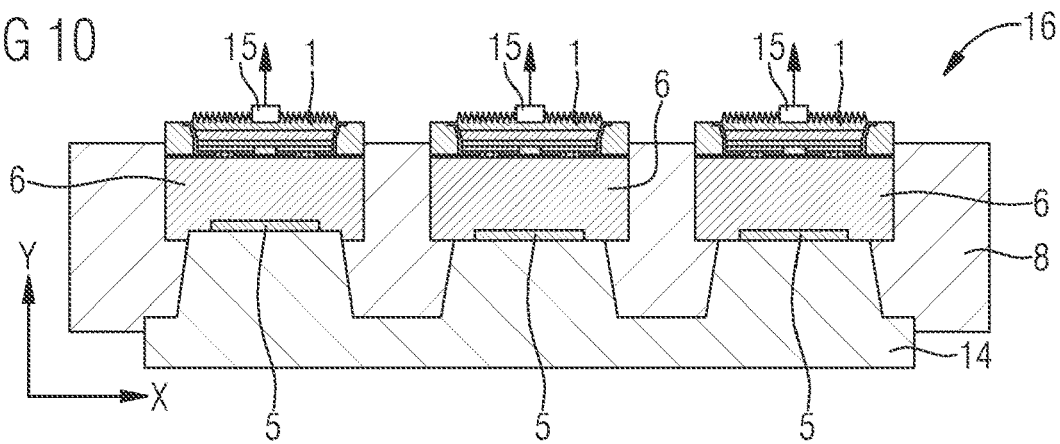

FIG. 10 shows an enlarged cross section through the arrangement from FIG. 8 in the y-x-plane.

Figure 11:
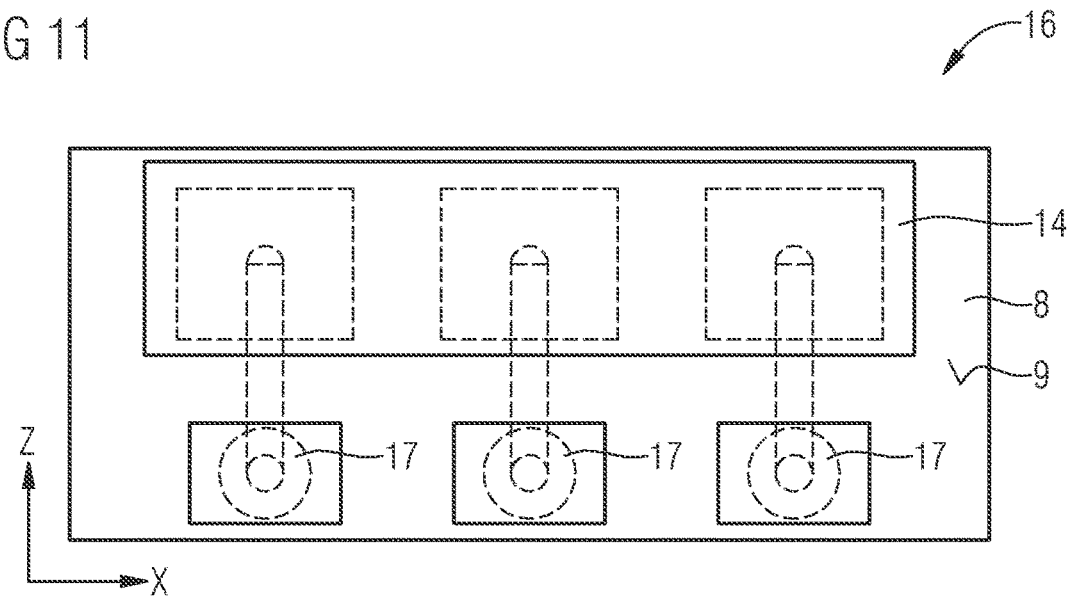

FIG. 11 shows a plan view of the rear side 9 of the first carrier 8 of the arrangement from FIG. 10. The collective line 14 comprises a rectangular surface extending along the x-direction over the three plated-through holes 17. Each plated-through hole 17 constitutes a rectangular contact pad on the rear side 9 of the first carrier 8. The first electrical contacts 4 of the three light-emitting diode chips 1 may thus be electrically contacted individually. At the same time, via the collective line 14, the second electrical contacts 5 of the three light-emitting diode chips 1 may be jointly electrically contacted with ground, for example. Depending on the embodiment chosen, a multi-chip module may also comprise more or fewer than three light-emitting diode chips 1 arranged in accordance with the arrangement in FIG. 8.

Figure 12:
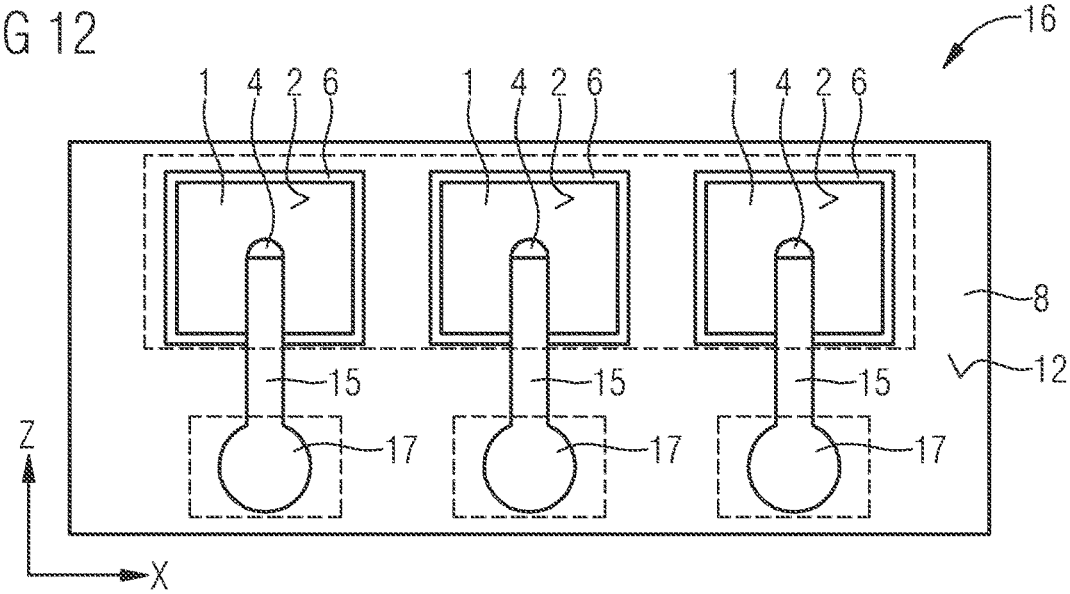

FIG. 12 shows a plan view of the front side 12 of the first carrier 8 of the group 16 from FIG. 10. In the embodiment illustrated, the light-emitting diode chip 1 is embedded in the main body 6. The main body 6 may be constituted from an electrically insulating material. Depending on the embodiment chosen, the main body 6 may also be dispensed with.

FIGS. 1 to 12 show a first method for producing a multi-chip module.

FIGS. 13 to 23 show method steps of a second method for producing a multi-chip module. FIG. 13 shows a cross section in the y-x-plane through a second carrier 20, on which three light-emitting diode chips 1 are arranged. The second carrier 20 comprises on a front side 21 a collective line 14 that is in electrical contact with the second electrical contacts 5 of the light-emitting diode chips 1. The light-emitting diode chips 1 are arranged with the rear side 3 on the collective line 14. The collective line 14 is connected via a second plated-through hole 22 to a rear-side metallization 23 formed on a rear side 24 of the second carrier 20. The second carrier 20 may be configured, for example, in the form of a circuit board or in the form of a leadframe. The second plated-through hole 22 may be introduced into the second carrier 20 with the aid of laser, drilling or etching methods and with the aid of galvanic methods, analogously to the plated-through hole of the first carrier.

FIG. 14 shows the cross section through the middle light-emitting diode chip 1 in the y-z-plane in FIG. 13. The collective line 14, the second plated-through hole 22 and the rear-side metallization 23 are constituted from an electrically conductive material 13. Moreover, the second plated-through hole 22 is led through a continuous recess of the second carrier 20 extending from the front side 21 of the second carrier 20 as far as the rear side 24 of the second carrier 20. The light-emitting diode chips 1 may be secured on the collective line 14 with the aid of adhesive bonding methods or with the aid of soldering methods.

FIG. 15 shows a further method step, in which the light-emitting diode chips 1 are embedded at least partly by the side faces in a mold material and a first carrier 8 is formed on the front side 21 of the second carrier 20. FIG. 15 shows the cross section in the y-x-plane. FIG. 16 shows a cross section through the middle light-emitting diode chip 1 in the y-z-plane of the arrangement in FIG. 15.

Figure 17:
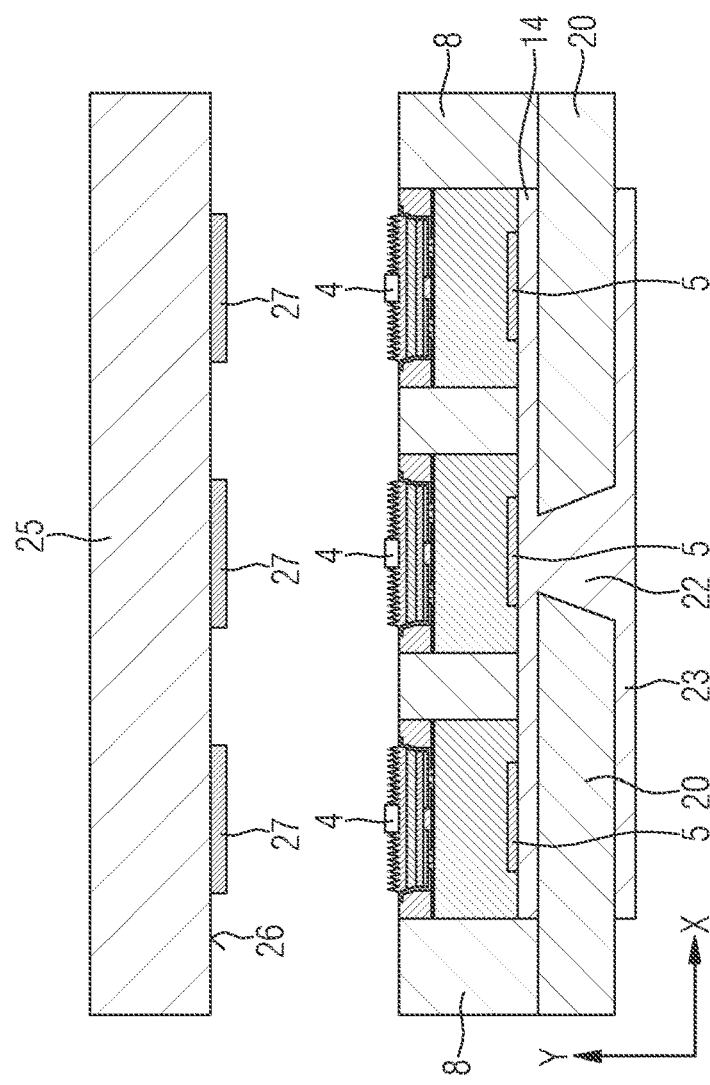

FIG. 17 shows a further method step, wherein a cover layer 25 is provided, for example, in the form of a plate, in particular in the form of a glass plate or sapphire plate. The cover layer 25 comprises control circuits 27 on an underside 26. In this case, a control circuit 27 may be provided for each light-emitting diode chip 1. The control circuit 27 is configured to supply at least one light-emitting diode chip 1 with current depending on driving of the control circuit 27. In addition, a control circuit 27 may be provided for a plurality of light-emitting diode chips 1. The control circuit 27 may comprise, for example, at least one transistor, in particular two transistors and a capacitor. The control circuit 27 may be formed using TFT technology. Moreover, the control circuit 27 may be produced from an optically transparent material. The control circuit 27 is illustrated schematically merely as a block. The control circuit 27 may comprise a plurality of layers and comprise, for example, transparent or semitransparent materials such as, for example, amorphous silicon, transparent electrically conductive oxides (TCO), such as, for example, indium tin oxide and indium zinc oxide, or carbon nanotube films or transparent conductive polymers and insulating layers.

Figure 18:
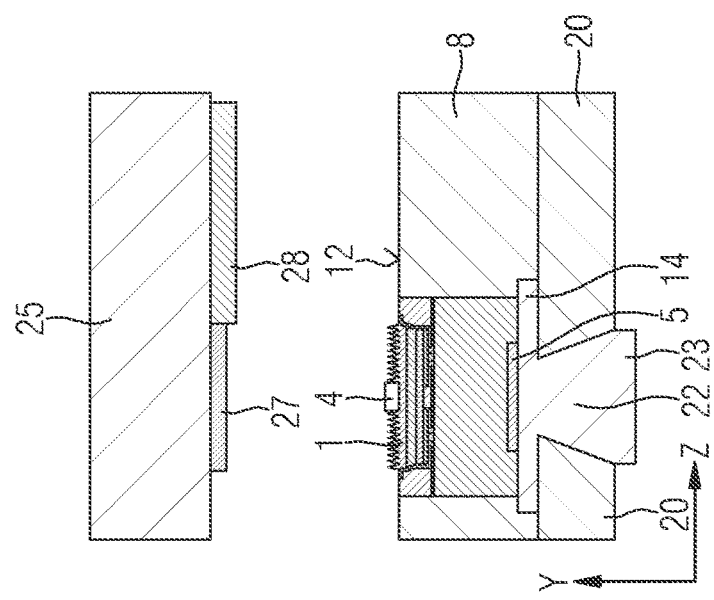

FIG. 18 shows a cross section of the arrangement from FIG. 17 in the y-z-plane. In the example chosen, each control circuit 27 is connected to a drive line 28 that is likewise arranged on the underside 26 of the cover layer 25. The drive line 28 is led in the z-direction for a predefined distance away from the control circuit 27.

Figure 19:
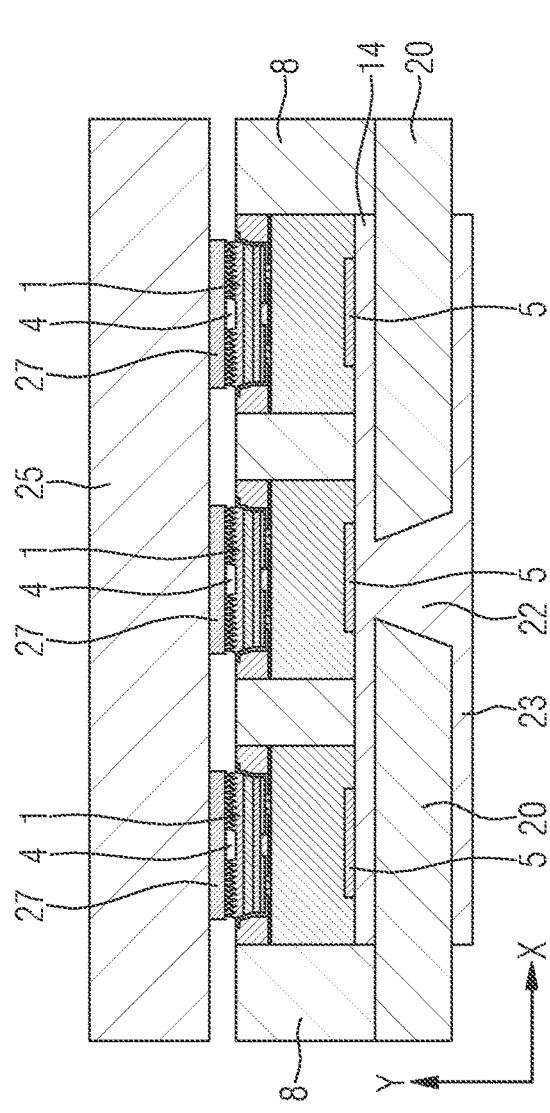

FIG. 19 shows a method step in which the cover layer 25 is secured on the front side 12 of the second carrier 8. For this purpose, electrical terminals of the control circuit 27 are connected to the first electrical contacts 4 of the light-emitting diode chips 1 directly or via a control line. By way of example, the cover layer 25 may be adhesively bonded onto the first carrier 8. Moreover, for forming the electrically conductive connection between the first electrical contacts 4 and the control circuits 27, by way of example, nanowires comprising silver may be used as control lines. Consequently, the cover layer 25 is fixedly connected to the arrangement of the light-emitting diode chips 1 and at the same time an electrically conductive connection is produced between an output terminal of the control circuit 27 and the respective first electrical contact 4 of the light-emitting diode chip 1.

Figure 20:
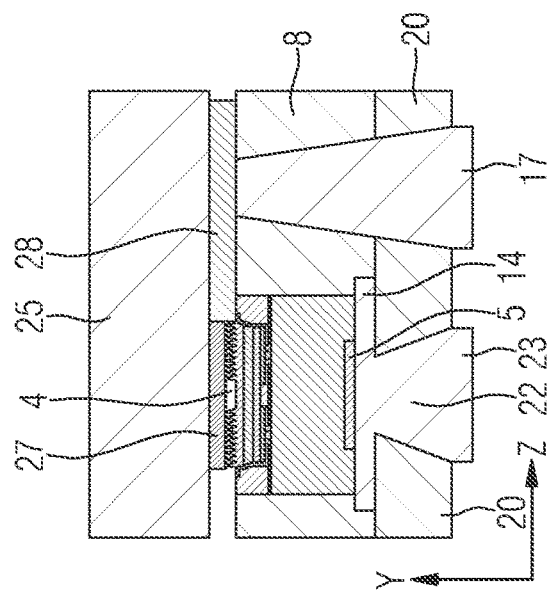

FIG. 20 shows a cross section of the arrangement from FIG. 19 in the y-z-plane. Plated-through holes 17 are introduced into the first and second carriers 8, 20 for each light-emitting diode chip 1 laterally next to the light-emitting diode chip 1. The plated-through hole 17 is led from a rear side 24 of the second carrier 20 as far as the front side 12 of the first carrier 8. Moreover, the plated-through hole 17 is connected to the drive line 28. The plated-through hole 17 is led as far as the rear side 24 of the second carrier 20. The drive line 28 is connected to an input terminal of the control circuit 27.

Figure 21:
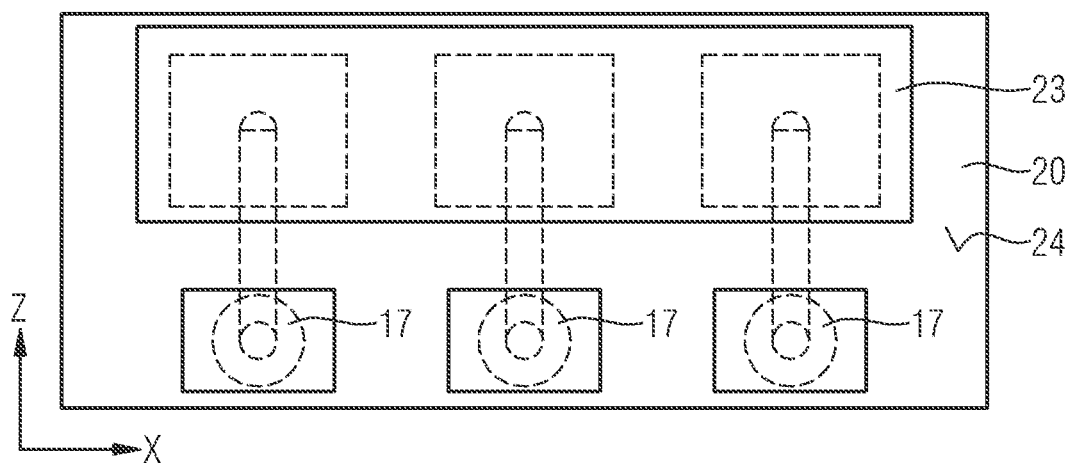

FIG. 21 shows a view of the rear side 24 of the second carrier 20.

Figure 22:
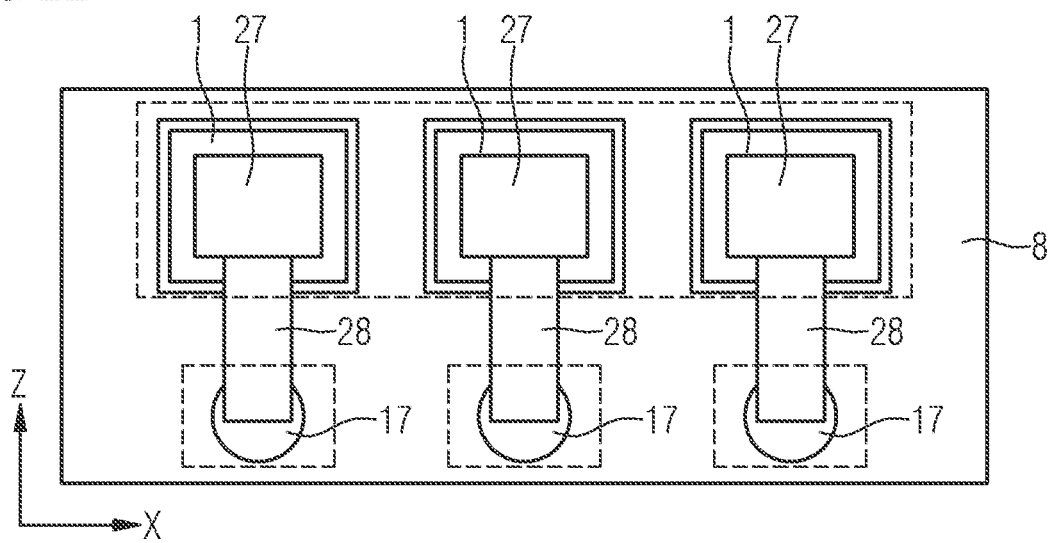

FIG. 22 shows a plan view of the arrangement from FIG. 20 in a schematic illustration, wherein the cover layer is not illustrated and the control circuits 27 and the drive line 28 are illustrated schematically.

Figure 23:
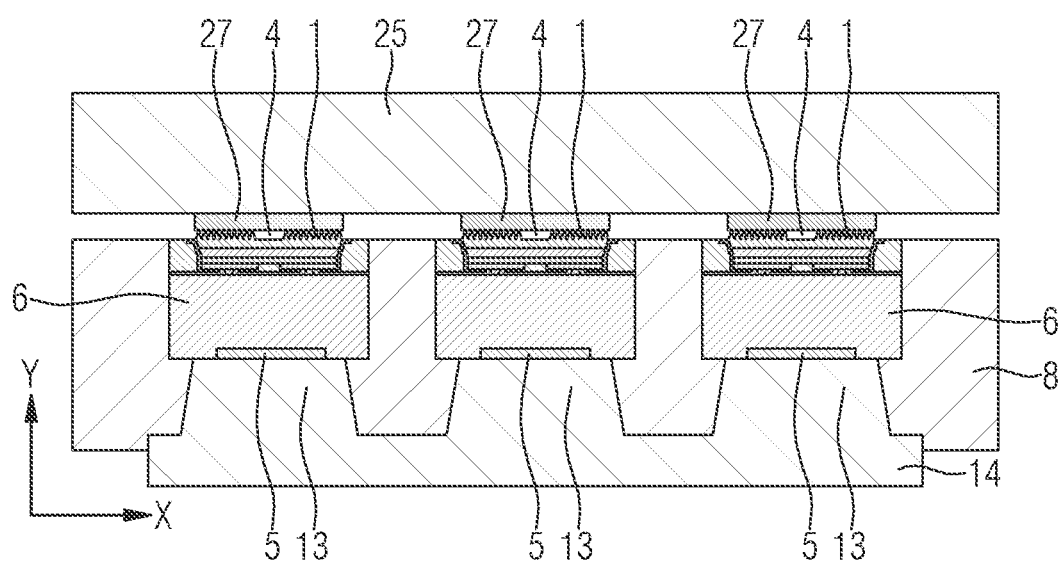

FIG. 23 shows a further embodiment of a multi-chip module configured substantially in accordance with the embodiment in FIG. 10, but wherein a cover layer 25 with control circuits 27 for each light-emitting diode chip 1 is additionally formed instead of the control line 15. The contacting from the drive line 28 through to the rear side 9 of the first carrier 8 is carried out by the plated-through hole 17 as in the embodiment in FIG. 10.

Figure 24:
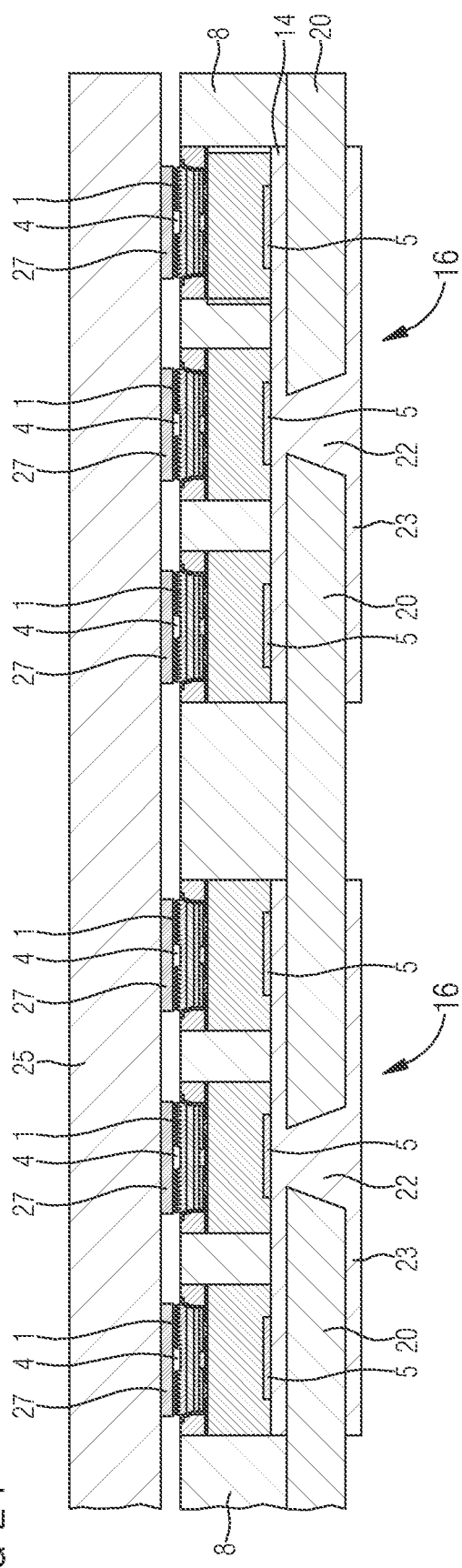
FIGS. 24 and 25 show method steps for producing a multi-chip module in the panel.

FIG. 24 shows an arrangement in accordance with FIG. 19, but wherein a plurality of groups 16 of light-emitting diode chips 1 are arranged in the first and second carriers 8, 20 and are covered with an integral cover layer 25 with control circuits 27. FIG. 24 shows a partial excerpt from an arrangement. Thus a multiplicity of groups 16 of light-emitting diode chips 1 may be arranged on an integral first and second carrier 8, 20 and be provided with an integral cover layer 25. The groups 16 of light-emitting diode chips 1 may comprise the same number or different numbers of light-emitting diode chips 1. A multi-module is produced by the individual groups of light-emitting diode chips 1 being singulated, as is illustrated schematically in FIG. 25.

The multi-module produced in accordance with the method in FIGS. 1 to 12 may also likewise be produced in the form of a plurality of groups which are arranged in the first carrier 8 and are singulated by means of corresponding method steps.

Figure 25:
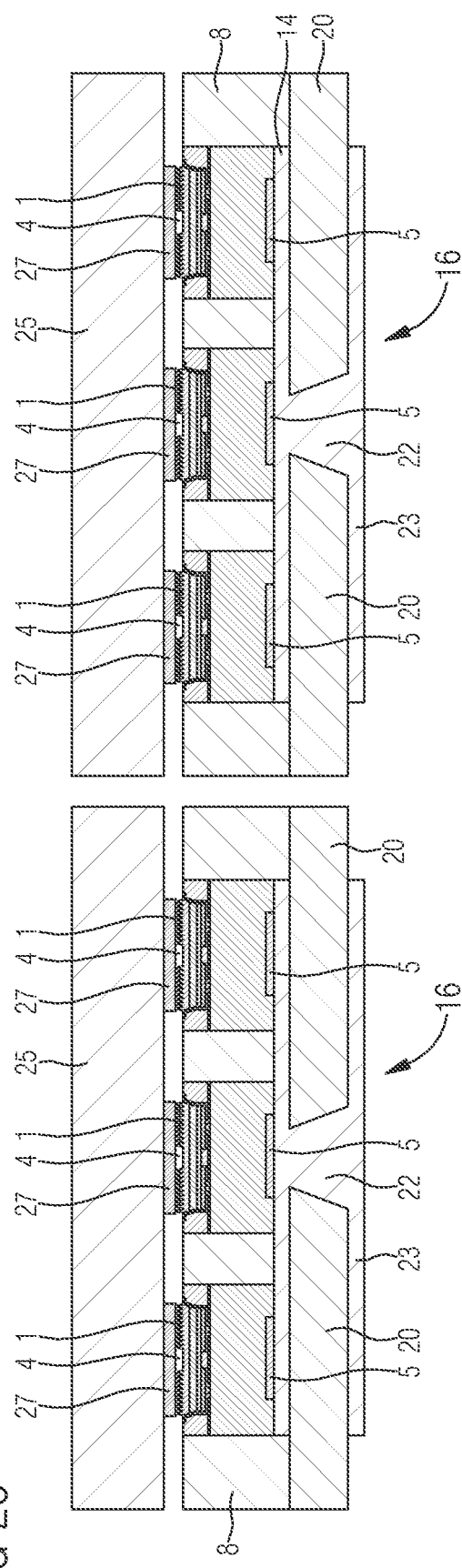
Figure 26:
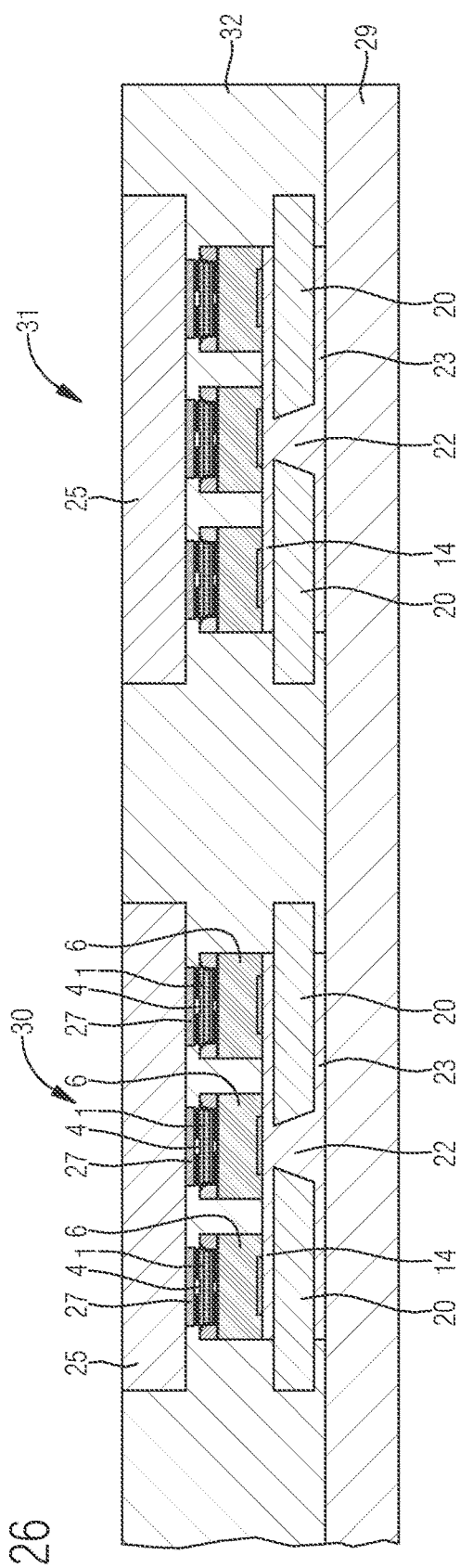
FIG. 26 shows a cross section through a further embodiment of a multi-chip module comprising a third carrier.

FIG. 26 shows a schematic cross section through a further embodiment, which substantially corresponds to the embodiment in FIG. 25, wherein at least one group 16 of three light-emitting diode chips 1, that is to say a multi-chip module 30, 31, is arranged on a third carrier 29. In the embodiment illustrated, two multi-chip modules 30, 31 are arranged on the third carrier 29. Moreover, the two multi-chip modules 30, 31 are embedded in a mold layer 32 arranged on the third carrier 29. The mold layer 32 is constituted from a mold material such as silicone or epoxy material, for example. By way of example, the mold layer 32 may be constituted from the same material as the first carrier 8. The third carrier 29 may be configured, for example, as a circuit board and comprise a multilayer wiring. Depending on the embodiment chosen, in this embodiment, the formation of the first carrier 8 may be dispensed with and the first carrier 8 may be configured in the form of the mold layer 32. The electrical contacting of the first contacts is carried out as in FIGS. 19 and 20.

Figure 27:
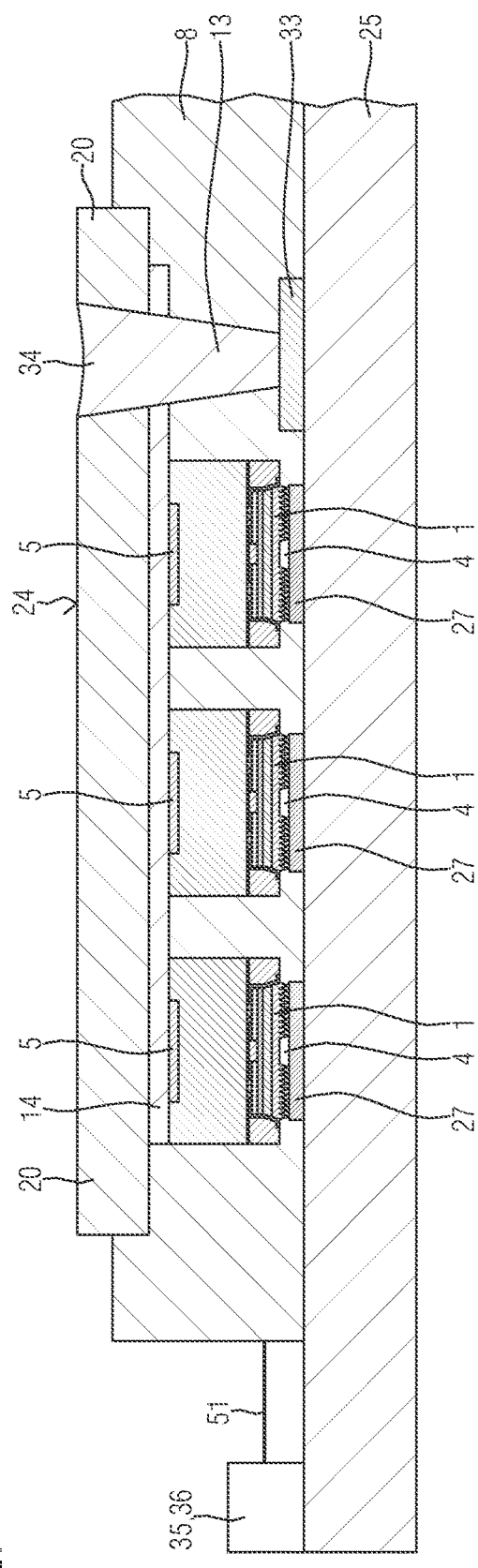
FIG. 27 shows a further embodiment of a multi-chip module.

FIG. 27 shows, in a schematic illustration, a multi-chip module 30 comprising three light-emitting diode chips 1 arranged with the radiation side on a cover layer 25. The cover layer 25 comprises control circuits 27. The control circuits 27 are connected to the first contacts 4 of the light-emitting diode chips 1. Moreover, the rear sides 3 of the light-emitting diode chips 1 are connected to a collective line 14 applied on a second carrier 20. Furthermore, the cover layer 25 comprises a contact pad 33. Furthermore, a first carrier 8 comprising mold material is formed on the cover layer 25, the light-emitting diode chips 1 and at least partly the second carrier 20 being embedded in said first carrier. Moreover, a third recess 34 is led from a rear side 24 of the second carrier 20 as far as the front side 21 of the second carrier 20 and through the first carrier 8 as far as the contact pad 33. In this case, the third recess 34 at least partly adjoins the collective line 14 or passes through the collective line 14. The third recess 34 is filled with an electrically conductive material 13. The collective line 14 is thus electrically conductively connected to the contact pad 33. The contact pad 33 and the drive lines (not illustrated) of the control circuits 27 are electrically conductively connected via electrical lines 51 to terminal contacts 35, 36 arranged on the first carrier and/or on the cover layer 25. The terminal contacts 35, 36 may be arranged laterally next to the first carrier 8. Only one terminal contact 35, 36 and only one electrical line 51 are illustrated schematically in the figure illustrated. With the aid of this arrangement, an entire wiring of the multi-chip module 30 may be embodied on the cover layer 25. The control circuits 27 and the wirings on the cover layer 25 may be constituted from an optically transparent material. Likewise, the cover layer 25 may be constituted from an optically transparent material such as glass or sapphire, for example.

Figure 28:
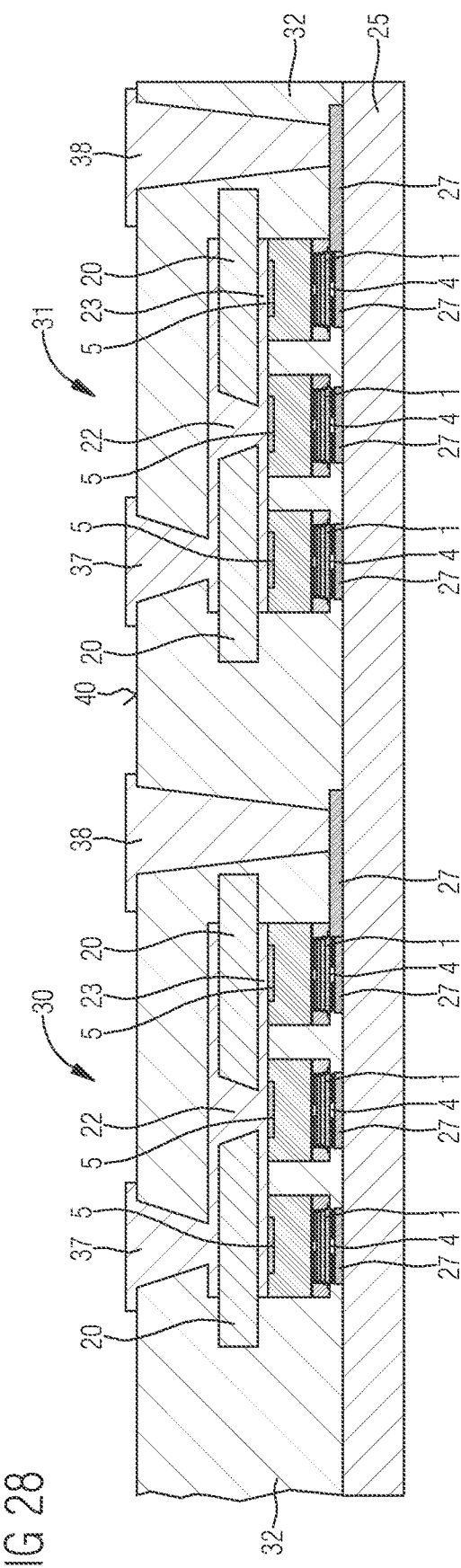
FIG. 28 shows a further embodiment of a multi-chip module.

FIG. 28 shows a further embodiment, in which two multi-chip modules 30, 31 are arranged on a cover layer 25. The multi-chip modules are configured substantially in accordance with the embodiment in FIG. 19. Moreover, the multi-chip modules 30, 31 are embedded in a mold layer 32, which also covers the rear-side metallizations 23 of the second carriers 20. Moreover, a third and a fourth plated-through hole 37, 38 are introduced into the mold layer 32. The third plated-through hole 37 extends from a rear side 40 of the mold layer 32 as far as the rear-side metallization 23 of the second carriers 20 of the multi-chip modules 30, 31. The fourth plated-through holes 38 extend from the rear side 40 of the mold layer 32 as far as the drive line 28 of the control circuits 27. FIG. 28 illustrates only one fourth plated-through hole 38 for a multi-chip module 30, 31. However, a fourth plated-through hole 38 is provided for each control circuit 27 of each light-emitting diode chip 1. The arrangement illustrated in FIG. 28 may subsequently be mounted on a circuit board. Moreover, the arrangement in FIG. 28 may be soldered directly onto an SMT connector.

Figure 29:
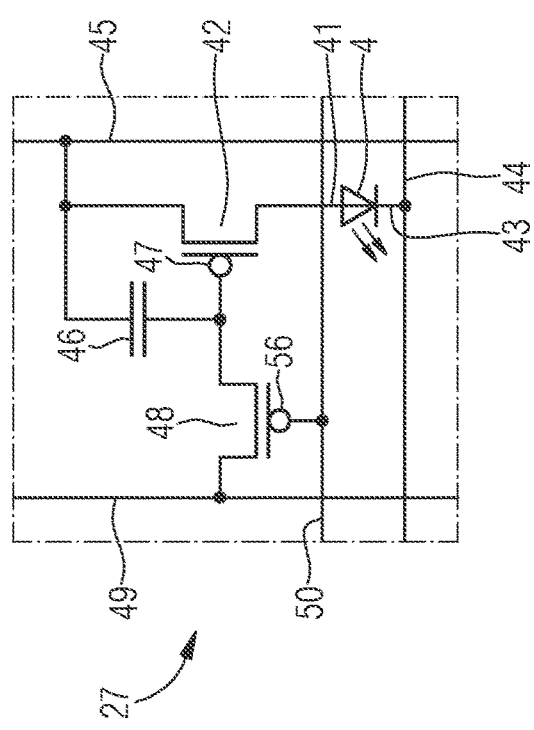
FIG. 29 shows an equivalent circuit diagram for the control circuit.

FIG. 29 shows an electrical equivalent circuit diagram for the control circuit 27 for a light-emitting diode chip 1 in a schematic illustration. A first electrical terminal 41 of the light-emitting diode chip 1 is connected to a second transistor 42. A second electrical terminal 43 of the light-emitting diode chip 1 is connected to a ground line 44. An input of the second transistor 42 is connected to a supply line 45. The supply line 45 provides a positive voltage. Furthermore, a capacitor 46 is connected between the input of the second transistor 42 and a gate terminal 47 of the second transistor 42. Furthermore, the gate terminal 47 of the second transistor is connected to a column line 49 via a first transistor 48. Moreover, a gate terminal 56 of the first transistor 48 is connected to a row line 50. Each of the light-emitting diode chips 1 is supplied with current by a drive circuit 27 depending on the driving of the column line 49 and the row line 50.

The control circuits 27 may additionally comprise electronically active diodes or transistor structures and capacitances. The control circuits and the electrical lines on the transparent cover layer may be constituted from transparent materials. Moreover, the electrical lines may also be constituted from thin metallic conductor tracks that bring about hardly any shading. The electrically conductive material 13 for the plated-through holes may be constituted, for example, from a transparent material, in particular from a transparent conductive adhesive. Moreover, electrically conductive nanowires comprising silver, for example, may be used.

The mold material of the first carrier 8 or the mold material of the mold layer 32 may be constituted from a black or reflective material. In the case of a white mold material, a thin black layer may be applied on the non-light-emitting surfaces for the purpose of enhancing contrast. The cover layer 25 may be configured as mixing element, that is to say as mixing optics. Moreover, the cover layer 25 may be configured as a diffusely scattering element at least at an area, in particular at the entire surface. Furthermore, the cover layer 25 may comprise further optical elements, such as lenses, for example.

Depending on the embodiment chosen, the wiring may also be formed on the top side of the first carrier 8. The multi-chip modules illustrated may be mounted directly onto corresponding devices or SMT connectors.

The proposed multi-chip modules afford the advantage that the complexity of the construction is reduced, wherein a simpler mounting technique at chip level and at submount level may be used. Moreover, an increased flexibility in the mounting of the multi-chip modules is provided. Furthermore, the proposed multi-chip modules comprise an increased robustness. Highly parallel die attach processes may be used for mounting the light-emitting diode chips on the second carrier. Fast serial die attach processes may also be used for mounting the multi-chip modules on a third carrier. The light-emitting diode chips may comprise an edge length of between 1 µm and 100 µm and be formed in a square fashion, for example. The multi-chip modules may comprise, for example, an edge length of from a few micrometers to a plurality of millimeters.

By means of the selection of multi-chip modules, a high yield may likewise be achieved at the module level. Furthermore, it is possible to achieve an ever finer pixelation by the clustering of emissive surfaces at the multi-chip module level. Moreover, known techniques from TFT technology may be used to realize the control circuits 27 for forming the individual driveability of the individual light-emitting diode chips 1. Furthermore, the proposed vertical light-emitting diode chips 1 comprise a simple construction.

The invention has been illustrated and described in greater detail on the basis of the preferred exemplary embodiments. Nevertheless, the invention is not restricted to the examples disclosed. Rather, other variations may be derived therefrom by the person skilled in the art, without departing from the scope of protection of the invention.

The invention claimed is:

1. A multi-chip module comprising:
a first carrier comprising a mold material;
at least two light-emitting diode chips embedded at least by side faces in the first carrier,
wherein the light-emitting diode chips comprise first electrical contacts on a front side and second electrical contacts on a rear side,
wherein the front side of the light-emitting diode chips is configured as a radiation side,
wherein the first electrical contacts are connected to control lines,
wherein the control lines are directly arranged on a front side of the first carrier,
wherein the second electrical contacts are connected to a collective line, and
wherein the collective line is led to a rear side of the first carrier; and
an optically transparent cover layer arranged on the front side of the first carrier, wherein the control lines are arranged between the cover layer and the first carrier.

2. The multi-chip module according to claim 1, wherein the first carrier comprises electrically conductive plated-through holes which are led from the front side to the rear side of the first carrier, and wherein a control line is connected to a plated-through hole.

3. The multi-chip module according to claim 2, further comprising a second carrier having third electrically conductive connections led from a front side to a rear side of the second carrier, wherein the third conductive connections are in each case connected to a plated-through hole of the first carrier.

4. The multi-chip module according to claim 1, wherein the first carrier comprises a fourth electrically conductive connection led from the front side to the rear side of the first carrier, wherein the fourth conductive connection is connected to the collective line, wherein the fourth conductive connection is connected to an electrical line, and wherein the electrical line is led on the front side of the first carrier laterally outward to terminal contacts.

5. The multi-chip module according to claim 1, wherein the control lines are connected to control circuits, wherein the control circuits are arranged between the first carrier and the cover layer, wherein the control circuits are connected to drive lines, and wherein the drive lines are connected to plated-through holes.

6. The multi-chip module according to claim 5, wherein a control circuit is assigned to each light-emitting diode chip, and wherein the control circuit is configured to supply or not to supply the light-emitting diode chip with current depending on driving.

7. The multi-chip module according to claim 5, wherein a control circuit consists essentially of an optically transparent material.

8. The multi-chip module according to claim 5, wherein the first carrier comprises electrical lines on the front side which are connected to the first electrical contacts, and wherein the electrical lines are led laterally to terminal contacts at an edge region of the first carrier.

9. The multi-chip module according to claim 8, wherein the first carrier is arranged on a front side of a second carrier, wherein the second carrier comprises a second conductive connection led from the front side to a rear side of the second carrier, wherein the second connection is connected to the collective line.

10. The multi-chip module according to claim 9, wherein the second carrier is arranged on a third carrier, wherein the third carrier comprises an electrical line connected to the second conductive connection of the second carrier, and wherein the third carrier is covered with a mold layer that at least laterally partly covers the first carrier.

11. The multi-chip module according to claim 1, wherein the first carrier comprises electrical lines on the front side which are connected to the first electrical contacts, and wherein the electrical lines are led laterally to terminal contacts at an edge region of the first carrier.

12. The multi-chip module according to claim 1, wherein the first carrier is arranged on a front side of a second carrier, wherein the second carrier comprises a second conductive connection led from the front side to a rear side of the second carrier, wherein the second connection is connected to the collective line.

13. The multi-chip module according to claim 12, wherein the second carrier comprises third electrically conductive connections led from a front side to a rear side of the second carrier, wherein the third conductive connections are in each case connected to a plated-through hole of the first carrier.

14. The multi-chip module according to claim 12, wherein the first carrier comprises a fourth electrically conductive connection led from a front side to a rear side of the first carrier, wherein the fourth conductive connection is connected to the collective line, wherein the fourth conductive connection is connected to an electrical line, wherein the electrical line is led on the front side of the first carrier laterally outward to terminal contacts.

15. The multi-chip module according to claim 1, wherein the transparent cover layer is embodied in form of a glass plate, and wherein the control lines are arranged directly on an underside of the glass plate and directly on the front side of the carrier.

16. The multi-chip module according to claim 1, wherein the transparent cover layer is embodied in form of a sapphire plate, and wherein the control lines are arranged directly on an underside of an underside of the sapphire plate and directly on the front side of the carrier.

17. A multi-chip module comprising:
a first carrier comprising a mold material; and
at least two light-emitting diode chips embedded at least by side faces in the first carrier,
wherein the light-emitting diode chips comprise first electrical contacts on a front side and second electrical contacts on a rear side,
wherein the front side of the light-emitting diode chips is configured as a radiation side,
wherein the first electrical contacts are connected to control lines,
wherein the control lines are directly arranged on a front side of the first carrier,
wherein the second electrical contacts are connected to a collective line,
wherein the collective line is led to a rear side of the first carrier,
wherein an optically transparent cover layer is arranged on the front side of the first carrier,
wherein the control lines are arranged between the cover layer and the first carrier,
wherein the control lines are connected to control circuits,
wherein the control circuits are arranged between the first carrier and the cover layer,
wherein the control circuits are connected to drive lines,
wherein the drive lines are connected to plated-through holes,
wherein the first carrier comprises electrical lines on the front side which are connected to the first electrical contacts, and
wherein the electrical lines are led laterally to terminal contacts at an edge region of the first carrier.

18. The multi-chip module according to claim 17, wherein the transparent cover layer is embodied in form of a plate, and wherein the control lines are arranged directly on an underside of the plate and directly on the front side of the carrier.

19. A multi-chip module comprising:
a first carrier comprising a mold material; and
at least two light-emitting diode chips embedded at least by side faces in the first carrier,
wherein the light-emitting diode chips comprise first electrical contacts on a front side and second electrical contacts on a rear side,
wherein the front side of the light-emitting diode chips is configured as a radiation side,
wherein the first electrical contacts are connected to control lines,
wherein the control lines are directly arranged on a front side of the first carrier,
wherein the second electrical contacts are connected to a collective line,
wherein the collective line is led to a rear side of the first carrier,
wherein the first carrier comprises electrical lines on the front side which are connected to the first electrical contacts, and
wherein the electrical lines are led laterally to terminal contacts at an edge region of the first carrier.

20. The multi-chip module according to claim 19, further comprising a transparent cover layer, wherein the transparent cover layer is embodied in form of a plate, and wherein the control lines are arranged directly on an underside of the plate and directly on the front side of the carrier.

* * * * *